United States Patent [19]

Sigmon et al.

[11] Patent Number: 4,982,168

[45] Date of Patent: Jan. 1, 1991

[54] HIGH PEAK POWER MICROWAVE OSCILLATOR

[75] Inventors: Bernard E. Sigmon, Tempe; Lawrence J. Schaumacher, Chandler, both of Ariz.

[73] Assignee: Motorola, Inc., Schaumburg, Ill.

[21] Appl. No.: 430,035

[22] Filed: Nov. 1, 1989

[51] Int. Cl.$^5$ .............................................. H03B 7/14
[52] U.S. Cl. .................... 331/107 SL; 331/99; 331/107 DP
[58] Field of Search ........ 331/96, 99, 107 R, 107 DP, 331/107 SL, 107 G, 107 T, 117 D

[56] References Cited

U.S. PATENT DOCUMENTS

| | | | |
|---|---|---|---|
| 3,858,123 | 12/1974 | Ohton et al. | 331/107 SL X |
| 3,868,594 | 2/1975 | Cornwell et al. | 331/99 |
| 4,311,970 | 1/1982 | Bert et al. | 331/107 R |
| 4,494,086 | 1/1985 | Dydyk | 331/107 SL X |
| 4,514,707 | 4/1985 | Dydyk et al. | 331/107 SL |
| 4,862,112 | 8/1989 | Singh | 331/107 SL |

Primary Examiner—David Mis
Attorney, Agent, or Firm—Jordan C. Powell

[57] ABSTRACT

Oscillator which maintains a high Q constant frequency over changes in temperature utilizes two parallel transmission lines having an active element embedded within one of the lines. A dielectric resonator oriented one-half wave length from the embedded transmission line generates a high impedance near the embedded transmission line at resonant frequency. The resonating energy is transferred to the second parallel transmission having a low impedance. An impedance inverter matches the low impedance to the output bias and transfers the high peak powers from the low impedance in the second transmission line. The active element is bias controlled.

17 Claims, 1 Drawing Sheet

HIGH PEAK POWER MICROWAVE OSCILLATOR

BACKGROUND OF THE INVENTION

This invention relates, in general, to oscillators, and more specifically, to microwave temperature compensated oscillators.

Microwave oscillators are very susceptible to changes in temperature. To overcome this temperature susceptibility, microwave oscillators have incorporated dielectric resonators. Dielectric resonators have temperature stable characteristics and can therefore keep the oscillator within the appropriate oscillating frequency. However, such dielectric resonator oscillators (DROs) only produce RF power levels on the order of 10 to 100 milliwatts. To obtain higher power outputs, amplifiers have been cascaded to the DROs. This increases costs, and adds both size and weight to the circuitry. Furthermore, achievable Mean Time Between Failures (MTBF) is reduced.

A microwave dielectric oscillator having high peak power output could replace currently used magnetrons. Such magnetrons have very low MTBF. Advances in solid state technology opens the way to replace short life, expensive magnetrons with solid state microwave oscillators.

SUMMARY OF THE INVENTION

Accordingly, it is an object of the present invention to provide a solid state microwave dielectric oscillator which achieves high peak power levels.

Another object of the present invention is to provide a high peak power microwave dielectric oscillator which can be incorporated on a single microstrip circuit board.

A high peak power microwave oscillator which maintains a high Q constant frequency over changes in temperature utilizes two parallel transmission lines having an active element embedded within one of the lines. A dielectric resonator oriented one-half wave length from the embedded transmission line generates a high impedance near the embedded transmission line at resonant frequency. The resonating energy is transferred to the second parallel transmission line. An impedance inverter generates a broadband impedance match in the second transmission line. The active element is bias controlled.

The above and other objects, features, and advantages of the present invention will be better understood from the following detailed description taken in conjunction with the accompanying drawings.

DETAILED DESCRIPTION OF THE INVENTION

Figure 1:
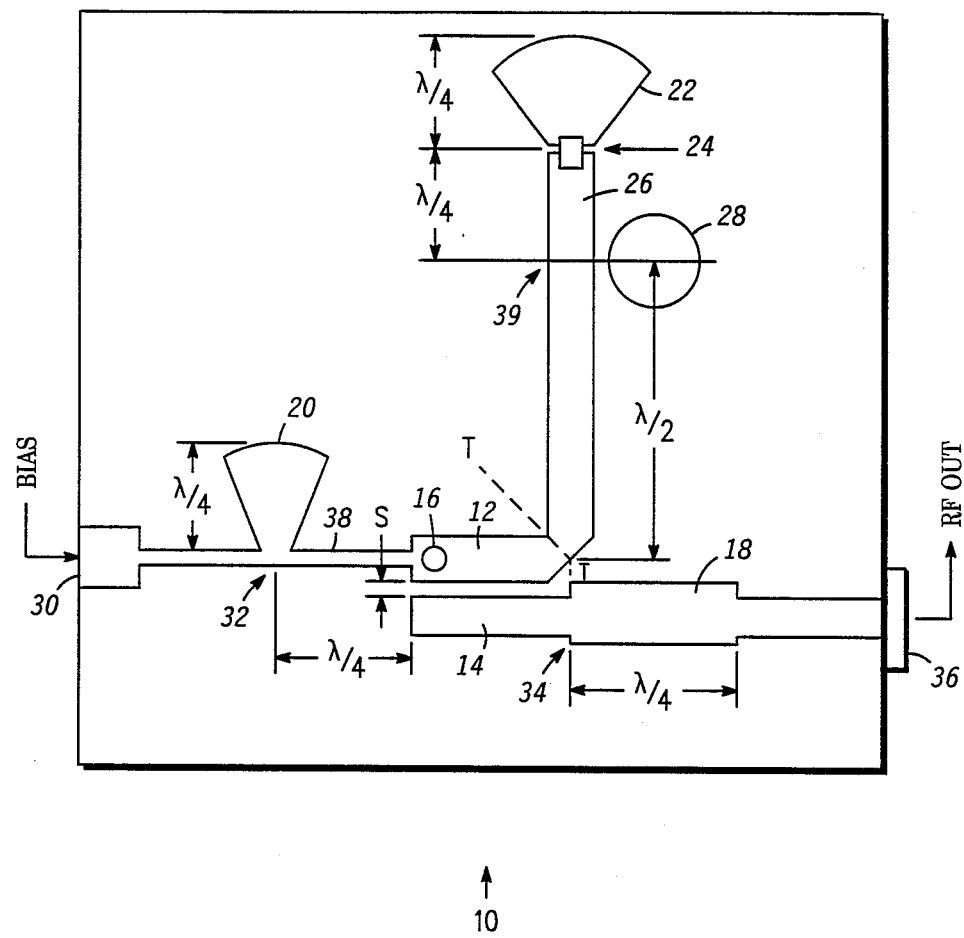
FIG. 1 is a schematic of a high peak power microwave dielectricly stabilized oscillator according to the present invention.

FIG. 1 shows a dielectric resonator oscillator (DRO) 10 capable of generating peak power levels in the range of 10 to 20 watts in X-band (8 to 10 GHz frequency). DRO 10, in its preferred embodiment, comprises first and second parallel impedance transmission lines 12 and 14, IMPact Avalanche Transit Time (IMPATT) diode 16, impedance inverter 18, AC short 20, AC short 22, stabilizer resistor 24, transmission line 26, and dielectric resonator 28.

DRO 10 operates in the following manner. A pulsed bias voltage is input at input 30. As is recognized by one familiar in the art, the bias operates on IMPATT diode 16 to cause IMPATT diode 16 to generate a resonating current within first parallel impedance transmission line (PITL) 12. The resonating current in first PITL 12 is kept from flowing back into input 30 by AC short 20 and quarter-wave line 38. As seen in FIG. 1, AC short 20 is a quarter-wave length back from first PITL 12 (and IMPATT diode 16) at point 32. Furthermore, AC short 20 is a quarter-wave long. The quarter-wave length of AC short 20 causes an impedance at point 32 which approximates an infinite impedance a quarter-wave length away at IMPATT diode 16. AC short 20 and quarter-wave line 38 can be replaced with an RF choke at IMPATT diode 16.

Imaginary plane T—T is shown in FIG. 1 bisecting the junction between first PITL 12 and transmission line 26. If plane T—T were an actual cut-off of first PITL 12 (eliminating transmission line 26), plane T—T would be the end of first PITL 12 and have an infinite impedance. DRO 10 would then be a low Q, free running oscillator. The energy generated within first PITL 12 would be transferred into second PITL 14. Due to the coupling of second PITL 14 with impedance inverter 18, an impedance match is created at the junction at a point 34. Impedance inverter 18 transforms the useful load at RF output 36 into a broadband impedance match. Impedance inverter 18 further couples the high peak pulsating power from PITL 14 at point 34 to RF output 36.

If DRO 10 is constructed only as a free-running oscillator, the RF signal at RF output 36 will be constantly fluctuating due to several factors including changes in temperature. To stabilize the resonant frequency, transmission line 26 is coupled to first PITL 12 at plane T—T. Transmission line 26 is further electromagnetically coupled to dielectric resonator 28 one-half-wave length from plane T—T. Dielectric resonator 28 will resonate at a single given frequency with a high Q value. The high Q and temperature stability of dielectric resonator 28 ensures constant frequency throughout changes in temperature. It is recognized by those skilled in the art of microwave transmission that an impedance will repeat itself every one-half wave length. Further, dielectric resonator 28 causes an impedance approaching infinity impedance at point 39 of transmissiom line 26 immediately adjacent to dielectric resonator 28. Therefore, since dielectric resonator is located one-half wave length from plane T—T, dielectric resonator 28 causes an infinite impedance at plane T—T at resonant frequency.

Stabilizer resistor 24 is coupled to the end of transmission line 26 one-quarter wave length from point 39. Stabilizer resistor 24 is generally a 50 ohm resistor and dissipates RF currents. When the energy is first transmission line 12 from IMPATT diode 16 is not at resonant frequency, plane T—T does not represent a high impedance. The resonating frequency passes plane T—T into transmission line 26 and into stabilizer resistor 24. Stabilizer resistor 24 dissipates all frequencies not at resonating frequency. AC short 22 operates as ground for stabilizer resistor 24.

At resonant frequency, the infinite impedance at plane T—T caused by dielectric resonator 28 causes the energy within first PITL 12 to transfer to second PITL 14. Since the infinite impedance is only generated at plane T—T at resonant frequency, second PITL 14 will only receive a pulsating signal from first PITL 12 at resonant frequency.

The value of impedance at plane T—T at point 34 (looking back towards IMPATT diode 16) is determined by two factors. The first is the spacings between first and second PITL 12 and 14. The greater the distances, the greater the impedance. The impedance at point 34 of plane T—T is also conditioned upon the width of each of first and second PITL 12 and 14. However, this condition does not correlate linearly, but must be determined by a complex mathematical process. The impedance is additionally affected by the width of transmission line 26.

Since DRO 10 transfers high power stable resonant frequencies from IMPATT diode 16 to RF output 36, large and costly amplification can be eliminated.

It should be noted that various elements of DRO 10 may be substituted with other elements commonly used in the microwave industry. For instance, IMPATT diode 16 may be replaced with a GUNN diode. Furthermore, dielectric resonator 28 may be replaced with other temperature compensating resonators depending upon the circuit requirements.

Thus there has been provided, in accordance with the present invention, a dielectric resonant oscillator that fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. A stable high power microwave oscillator comprising:
    first and second parallel transmission lines, said first and second parallel transmission lines coupled to each other;
    active diode means for generating a pulsating current when acted upon by a voltage;
    said active diode means coupled to said first parallel transmission line;
    temperature stable resonator means for generating an electromagnetic signal which resonates at a constant frequency throughout temperature changes when acted upon by an energy field;
    said temperature stable resonator means coupled to, and one-half wave length from, said first parallel tansmission line;
    said first parallel transmission line supplying said energy field to said temperature stable resonator means, and said temperature stable resonator means supplying said electromagnetic signal to said first transmission line; and
    said second parallel transmission line outputting high peak power resonating signal.

2. A stable high power microwave oscillator according to claim 1 wherein said second parallel line comprises:
    transmission line means for receiving said energy field from said first parallel transmission line, said transmission line means parallel and adjacent to said first parallel transmission line;
    impedance inverter means coupled to said transmission line means;
    said transmission line means achieves a high impedance match at a point where said transmission line means and said impedance inverter means are coupled; and
    said impedance inverter means for transforming a load into a broadband impedance match.

3. A stable high power microwave oscillator according to claim 1 wherein the oscillator further comprises:
    third transmission line coupled to said first parallel transmission line; and
    said temperature stable resonator means oriented adjacent to, and one-half wave length along (with respect to said first parallel transmission line) said third transmission line.

4. A stable high power microwave oscillator according to claim 3 wherein the oscillator further comprises:
    resistive element coupled to an end of said third transmission line opposite said first parallel transmission line; and
    short means for shorting DC voltages, said short means coupled to said resistive element.

5. A stable high power microwave oscillator according to claim 3 wherein the oscillator further comprises:
    bias means for supplying said voltage to said active diode means; and
    said bias means coupled to said active diode means.

6. A stable high power microwave oscillator according to claim 5 wherein the oscillator further comprises:
    AC means for impeding the flow of resonant frequency signals to said bias means; and
    said bias means AC coupled between said bias means and said active diode means.

7. A stable high power microwave oscillator according to claim 1 wherein said active diode means comprises an IMPact Avalanche Transit Time (IMPATT) diode.

8. A stable high power microwave oscillator according to claim 1 wherein said active diode means comprises a GUNN diode.

9. A stable high power microwave oscillator according to claim 1 wherein said temperature stable resonator means comprises a dielectric resonator.

10. A stable high power microwave oscillator according to claim 4 wherein said resistive element comprises a resistor.

11. A stable high power microwave oscillator according to claim 6 wherein AC means comprises a quarter-wave transmission line oriented a quarter-wave length from said active diode means.

12. A stable high power microwave oscillator according to claim 6 wherein AC means comprises an AC choke.

13. A method for generating a temperature stable microwave resonating frequency comprising the steps of:
    generating a resonating current within an active device;
    coupling the resonating current to a first transmission line;
    creating a high impedance to said first transmission line from a temperature compensated source when said resonating current is at a determined resonant frequency;
    removing said high impedance from said first transmission line when said resonating current is not at said resonant frequency to allow said resonating current to be transmitted to a source of electrical ground;

electromagnetically transmitting said resonating current to an adjacent, parallel, non-contacting second transmission line;

generating a resonating high impedance corresponding to said electromagnetically transmitted resonating current at an output of said second transmission line;

impedance matching said resonating high impedance of said second transmission line to generate a high power output; and outputting said high power output.

14. A stable high power microwave oscillator comprising:

oscillating means for generating a temperature stable resonant frequency from an input bias;

high power means for receiving said resonant frequency to generate a resonating high impedance, said high power means inverting said resonating high impedance to output a high power oscillating signal; and said high power means electromagnetically coupled to said oscillating means.

15. A stable high power microwave oscillator according to claim 14 wherein said oscillating means comprises:

resonator means for generating a resonating frequency from said input bias;

temperature stabilizing means for stabilizing said resonating frequency at a predetermined frequency;

said temperature stabilizing means coupled to said resonator means; and said resonator means producing said temperature stable resonant frequency.

16. A stable high power microwave oscillator according to claim 15 wherein said resonator means comprises:

an active diode, said active diode receiving said bias and generating a resonating current;

a first transmission line coupled to said active diode; and said transmission line further coupled to said temperature stabilizing means.

17. A stable high power microwave oscillator according to claim 16 wherein said temperature stabilizing means comprises:

second transmission line coupled to said first transmission line; and dielectric resonator electromagnetically coupled to said second transmission line one-half wave length from said first transmission line.

* * * * *